US010359812B2

(12) United States Patent
Brotzman, Jr. et al.

(10) Patent No.: US 10,359,812 B2
(45) Date of Patent: Jul. 23, 2019

(54) DEVICE COMPONENT EXPOSURE PROTECTION

(71) Applicant: Motorola Mobility LLC, Chicago, IL (US)

(72) Inventors: Richard W. Brotzman, Jr., Naperville, IL (US); Deborah M. Paskiewicz, Downers Grove, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/839,538

(22) Filed: Dec. 12, 2017

(65) Prior Publication Data

US 2019/0179374 A1    Jun. 13, 2019

(51) Int. Cl.
*G06F 1/16* (2006.01)
*G06F 1/18* (2006.01)

(52) U.S. Cl.
CPC ............ *G06F 1/1656* (2013.01); *G06F 1/182* (2013.01)

(58) Field of Classification Search
CPC .......... G06F 1/181–182; G06F 1/1656; H05K 7/20218–20381; H05K 7/20409–20418; H05K 7/20009–202; H01L 23/367–3677; H01L 23/473; H01L 23/46–467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,017,406 A | 5/1991 | Lutz | |
| 6,195,267 B1* | 2/2001 | MacDonald, Jr. | H01L 23/42 174/377 |
| 6,294,731 B1* | 9/2001 | Lu | H01L 23/433 174/388 |
| 6,377,464 B1* | 4/2002 | Hashemi | H01L 23/552 257/516 |
| 7,116,557 B1* | 10/2006 | Raby | H05K 1/021 361/720 |
| 7,286,360 B2* | 10/2007 | Sohn | H01L 23/3672 257/E23.103 |
| 7,359,204 B1* | 4/2008 | Jang | G06K 19/07 235/492 |

(Continued)

OTHER PUBLICATIONS

"International Search Report and Written Opinion", Application No. PCT/US2018/064225, Mar. 29, 2019, 12 pages.

(Continued)

*Primary Examiner* — Anthony M Haughton
*Assistant Examiner* — Razmeen Gafur
(74) *Attorney, Agent, or Firm* — SBMC (57) ABSTRACT

In implementations of device component exposure protection, a computing device includes device components enclosed within a housing. The device components are assembled within the housing and enclosed within the housing upon completion of assembly of the computing device. The computing device further includes a protective material contained within the housing, which fills void spaces around the device components. The protective material prevents exposure of the device components to external matter that the computing device is exposed to upon completion of the assembly.

21 Claims, 6 Drawing Sheets

(56) References Cited

U.S. PATENT DOCUMENTS

| | | | | |
|---|---|---|---|---|
| 8,278,880 B2* | 10/2012 | Nakajima | ............... | H04B 1/036 |
| | | | | 320/150 |
| 8,730,675 B2* | 5/2014 | Sano | ................... | H04M 1/0202 |
| | | | | 165/104.33 |
| 8,837,151 B2* | 9/2014 | Hill | .................... | H05K 7/20472 |
| | | | | 361/704 |
| 2002/0106614 A1* | 8/2002 | Prince | .................. | G09B 21/003 |
| | | | | 434/114 |
| 2004/0046909 A1* | 3/2004 | Sekiguchi | ............. | G02F 1/1345 |
| | | | | 349/113 |
| 2004/0244397 A1* | 12/2004 | Kim | ........................ | G06F 1/203 |
| | | | | 62/259.2 |
| 2010/0008047 A1* | 1/2010 | Moon | ................ | H05K 7/20463 |
| | | | | 361/714 |
| 2010/0271783 A1* | 10/2010 | Miyashita | ......... | G02F 1/133385 |
| | | | | 361/707 |
| 2013/0021280 A1* | 1/2013 | Dabov | .................. | G06F 1/1626 |
| | | | | 345/173 |
| 2013/0265722 A1* | 10/2013 | Hill | ........................ | G06F 1/203 |
| | | | | 361/707 |
| 2013/0335898 A1* | 12/2013 | Stevens | ................. | H05K 13/00 |
| | | | | 361/679.01 |
| 2015/0070836 A1* | 3/2015 | Yairi | ........................ | G06F 1/20 |
| | | | | 361/679.47 |
| 2015/0169015 A1* | 6/2015 | Yebka | ..................... | G06F 1/203 |
| | | | | 361/679.54 |
| 2015/0261260 A1 | 9/2015 | Nicholas et al. | | |
| 2015/0301568 A1* | 10/2015 | Hill | .................... | H05K 7/20445 |
| | | | | 361/714 |
| 2015/0342089 A1* | 11/2015 | Kim | ................... | H05K 7/20336 |
| | | | | 361/700 |
| 2016/0135286 A1* | 5/2016 | Hwang | .................. | H05K 1/189 |
| | | | | 361/720 |
| 2016/0174357 A1* | 6/2016 | Paine | ..................... | H01R 12/72 |
| | | | | 361/711 |
| 2016/0269067 A1 | 9/2016 | Pidwerbecki et al. | | |
| 2016/0346977 A1* | 12/2016 | Drysdale | ........... | B29C 45/14639 |
| 2018/0059722 A1* | 3/2018 | McClure | ............... | G06F 1/1613 |

OTHER PUBLICATIONS

"Potting (electronics)", Retrieved at: https://en.wikipedia.org/w/index.php?title=Potting+(electronics)&oldid=804683299—on Apr. 8, 2019, Oct. 10, 2017, 2 pages.

"Resins for potting and encapsulation in the electronics and electrical industries", Retrieved at: https://web.archive.org/web/20171120112639/https://www.electrolube.com/technical-articles/resins-for-potting-and-encapsulation/—on Apr. 8, 2019, Nov. 20, 2017, 9 pages.

\* cited by examiner

DEVICE COMPONENT EXPOSURE PROTECTION

BACKGROUND

Electronic devices often include multiple electronic components attached to a substrate, such as a printable circuit board (PCB), which provides a base to support the electronic components, including integrated circuits, electronic subassemblies, capacitors, resistors and similar devices. PCBs also provide connection paths to electrically connect components to form electrical circuits which enable functioning of an electronic device. Electronic components attached to a PCB are likely to electrically short or malfunction after brief exposure to liquids or moisture. More specifically, exposed metal areas having voltage differentials in close proximity can easily experience short circuit events when corrosion or water immersion bridges the gap between such areas.

Conventional techniques for making electronic devices water-resistant or waterproof typically involve a cover placed on or around an electronic device housing after the electronic device has been assembled. These conventional techniques provide numerous shortcomings, such as lack of protection from accidental liquid encounters when not in place, failure to provide device protection from solid particles (e.g., dust) when not in place, bulky form factors that reduce device functionality, failure to provide device protection if not installed correctly by an end user, disabling functionality and accessibility of device ports such as a headphone jack or power connector, and so forth.

Other conventional techniques involve water-resistant surface treatments applied to electronic devices. One example of a conventional water-resistant surface treatment includes applying a polymeric coating formed by exposing the electronic device to static or pulsed plasma for a sufficient period of time to allow a polymeric layer to form on the surface of the electronic device. In another example, a coating comprising halo-hydrocarbon polymers is applied on a PCB and a board assembly by plasma etching, plasma activation, plasma polymerization and coating, and/or liquid-based chemical treatment. In yet another example, waterproof bulk conformal coatings are used in automotive electronic assemblies, and parylene films can be used to coat small devices, such as hearing aids using a highly reactive vapor phase precursor generated by pyrolysis of a solid.

However, conventional techniques for water-resistant surface treatments applied to electronic devices are not without limitations. First, surface treatment-induced high impedance, open circuit, or intermittent function of movable electronic contacts result in both component- and system-level functional failure of the electronic device. Additionally, plasma processing of a fluorohydrocarbon precursor often results in low process yields because fluorohydrocarbon molecules are large, unable to diffuse through a reticulated structure of substrate assemblies of electronic devices, and molecular fragments created by the plasma processing do not readily wet the surfaces of substrate assemblies, thus preventing complete encapsulation of the substrate assemblies. Further, electronic devices have interconnects, such as board-to-board (BTB), zero insertion force (ZIF) connectors, universal spring contacts, pogo pin contacts, dome switch assemblies, SIM and SD card readers, and so forth. Failures of these interconnects typically results from contamination of an electrical contact zone in an interconnect from application of a water-resistant surface treatment, or mechanical disruption of the water-resistant surface treatment due to mechanical shock or mechanically disconnecting the interconnect during device rework. Interconnect failures are especially prevalent when the water-resistant surface treatment is a film with a thickness greater than 500 nm, and large molecular weight films such as parylene and cross-linked fluroacrylates. These conventional techniques thus require compromises to a film's water resistance or laborious masking of contacts, and result in significant reduction in achieved water resistance, increasing manufacturing complexity and cost, and ultimately do not provide the intended goal of waterproofing or sufficiently water resisting electronic devices.

BRIEF DESCRIPTION OF THE DRAWINGS

Implementations of device component exposure protection are described with reference to the following Figures. The same numbers may be used throughout to reference similar features and components shown in the Figures.

DETAILED DESCRIPTION

Implementations of device component exposure protection are described, and provide techniques for waterproof and/or water-resistant protection of electronic devices, such as during device manufacture, without the need for aftermarket, bulky exterior casings. For example, a protective material fills void spaces around device components within a housing of an electronic device during device assembly, providing protection to internal components of the device from water, dust, contact, and other environmental hazards.

In aspects of device component exposure protection, a computing device includes device components enclosed within a housing, such as a mobile device or mobile phone, a tablet device, a laptop computing device, a digital camera, and so forth. The device components can be assembled and enclosed within the housing upon completion of assembly of the computing device. The computing device further includes a protective material contained within the housing, which fills void spaces around the device components. The void spaces around the device components are filled with the protective material, which prevents exposure of the device components to external matter that the computing device is exposed to upon completion of the assembly. The protective material, for instance, includes low-modulus elastomers (LME), thermoplastics (TP), or one or more combinations of LME and TP. The protective material protects the device components from external matter that may enter into the housing of the device, such as water, dust, and other materials present in an environment of the device. The device components are protected from the inside-out of the computing device. The features of device component exposure protection described herein can be integrated into device assembly and repair techniques with minimal adaptations, and provide device users with a device protected from environmental hazards without the need for after-market, bulky device add-ons that cover the exterior of a device.

While features and concepts of device component exposure protection can be implemented in any number of different devices, systems, environments, and/or configurations, implementations of device component exposure protection are described in the context of the following example devices, systems, and methods.

Figure 1:
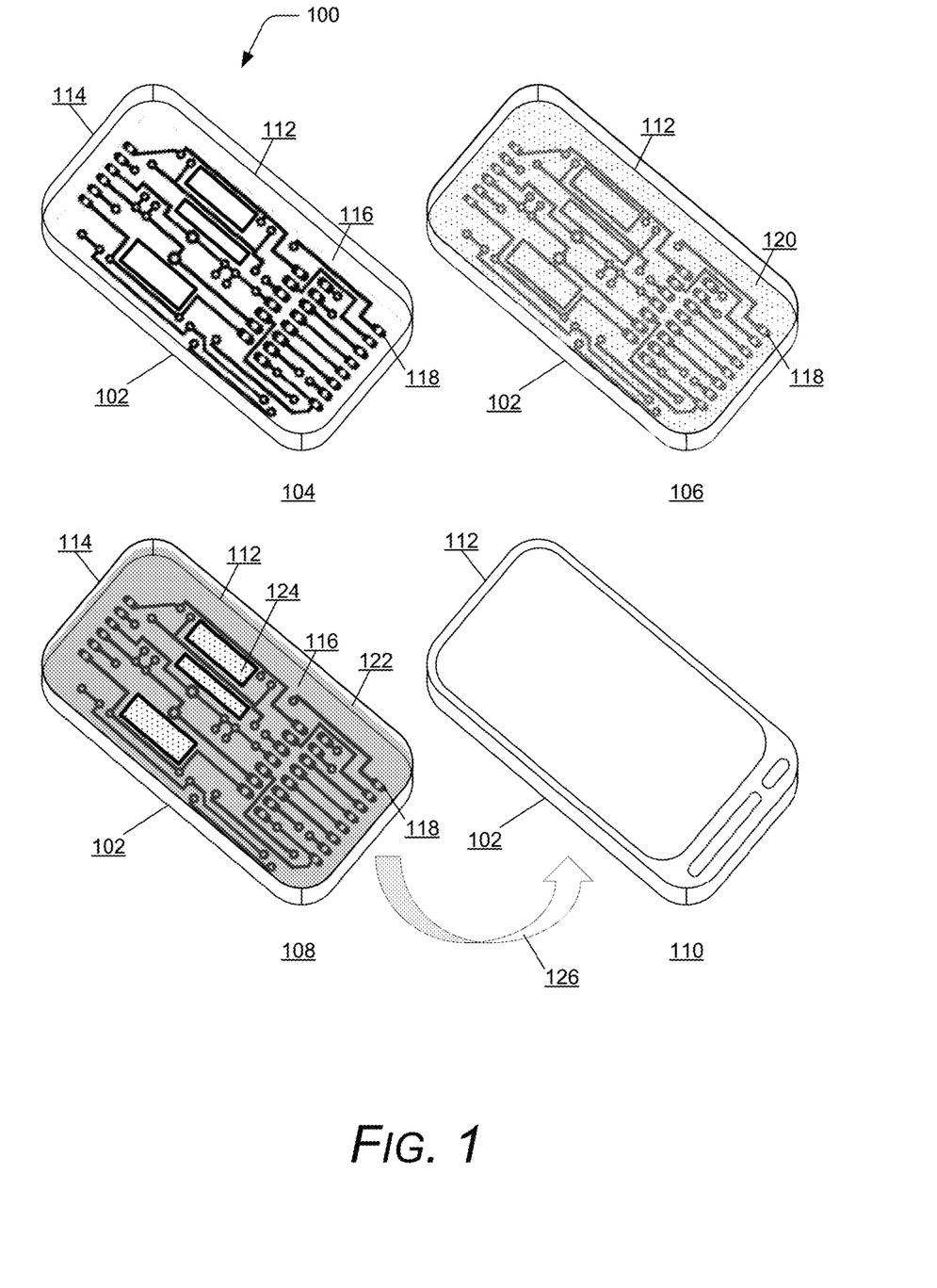
FIG. 1 illustrates an example of an electronic device and techniques of device component exposure protection as described herein.

FIG. 1 illustrates an example 100 of a computing device 102 shown at various stages of assembly 104, 106, 108, and 110 that illustrate the techniques of device component exposure protection as described herein. In this example, the computing device 102 may be any type of computing device, such as a mobile phone, tablet, laptop computer, desktop computer, computer accessory (e.g., keyboard, mouse, headphones, webcam, etc.), wearable electronic device (e.g., watch, glasses/goggles, microphone, etc.), and so forth. Generally, the computing device 102 is implemented with various components such as a processing system and memory, as well as any number and combination of different components as further described in reference to the example device shown in FIG. 7.

In aspects of device component exposure protection, the computing device 102 includes device components 112 enclosed within a housing 114. The device components 112 may include a substrate assembly 116 with various components attached to the substrate assembly. The substrate assembly 116 may include any type of substrate, such as those used for attaching integrated circuits within the computing device 102, for example a ceramic substrate, a glass substrate, a silicone substrate, a polyimide substrate, a printable circuit board (PCB), and so forth. The substrate assembly 116 provides a base to support electronic components 118 (and non-electronic computing device components), such as integrated circuits, electronic subassemblies, capacitors, resistors, and similar devices, along with providing connection paths to electrically connect the electronic components to form electrical circuits, which are used for functioning of the computing device 102. The electronic components 118 are connected to the substrate assembly using connectors, such as board-to-board (BTB), zero insertion force (ZIF) connectors, universal spring contacts, pogo pin contacts, dome switch assemblies, SIM and SD card readers, and so on.

In the first stage of assembly 104, the computing device 102 is shown with a face of the housing 114 removed and the device components 112 exposed via the removed face of the housing. In an example of device component exposure protection, low-modulus elastomers (LME) and/or thermoplastics (TP) are applied as precursor compositions to the device components 112 of the computing device 102, such as a PCB substrate, electronic components associated with the PCB, connectors between components and the PCB, and so forth. Different LME-TP combinations impart different properties, and therefore enable better protection of specific components depending on the location and function of the device components 112, or better protection of the different portions of the substrate assembly 116 themselves.

LME and/or TP are used to fill the void spaces within the housing 114 of the computing device 102 and encapsulate internal assemblies of the device components 112, the electronic components 118, connectors between the electronic components 118 and the substrate assembly, and so forth. With the void spaces within the housing filled with LME and/or TP, the device components 112 of the computing device 102 are protected from water and other materials to which the computing device may be exposed. Further, the LME and/or TP absorbs mechanical energy from shocks experienced when the electronic device is dropped or contacted, further protecting the electronic device and its components.

LME and/or TP may be bound to the surface of the electronic components 118 attached to the substrate assembly 116, such as by mechanical interlocking and/or reacting LME and/or TP precursors with coupling agents. The coupling agents form a bond between the LME and/or TP and the electronic components 118. For example, consider the second stage of assembly 106, in which one or more TP films 120 are applied to the device components 112. The TP films 120 may be applied in a variety of ways, and using a variety of formulations.

TP are a class of copolymers or a physical mix of polymers (e.g., a plastic and a rubber), consisting of materials having both thermoplastic and elastomeric properties. While most elastomers are thermosets, thermoplastics flow at an elevated temperature and show characteristics typical of both rubbery materials and plastic materials. TP have the ability to stretch to moderate elongations and return to near original shape, allowing electrical (and non-electrical) interconnects to be disconnected and reconnected without damage to the TP. The ability of TP to stretch and return to its near original shape is enabled by crystals formed between chains, which effectively become cross-links in the structure of the TP. TP are formed with thermo-reversible bonds, while elastomers are formed with permanent covalent bonds.

Figure 2:
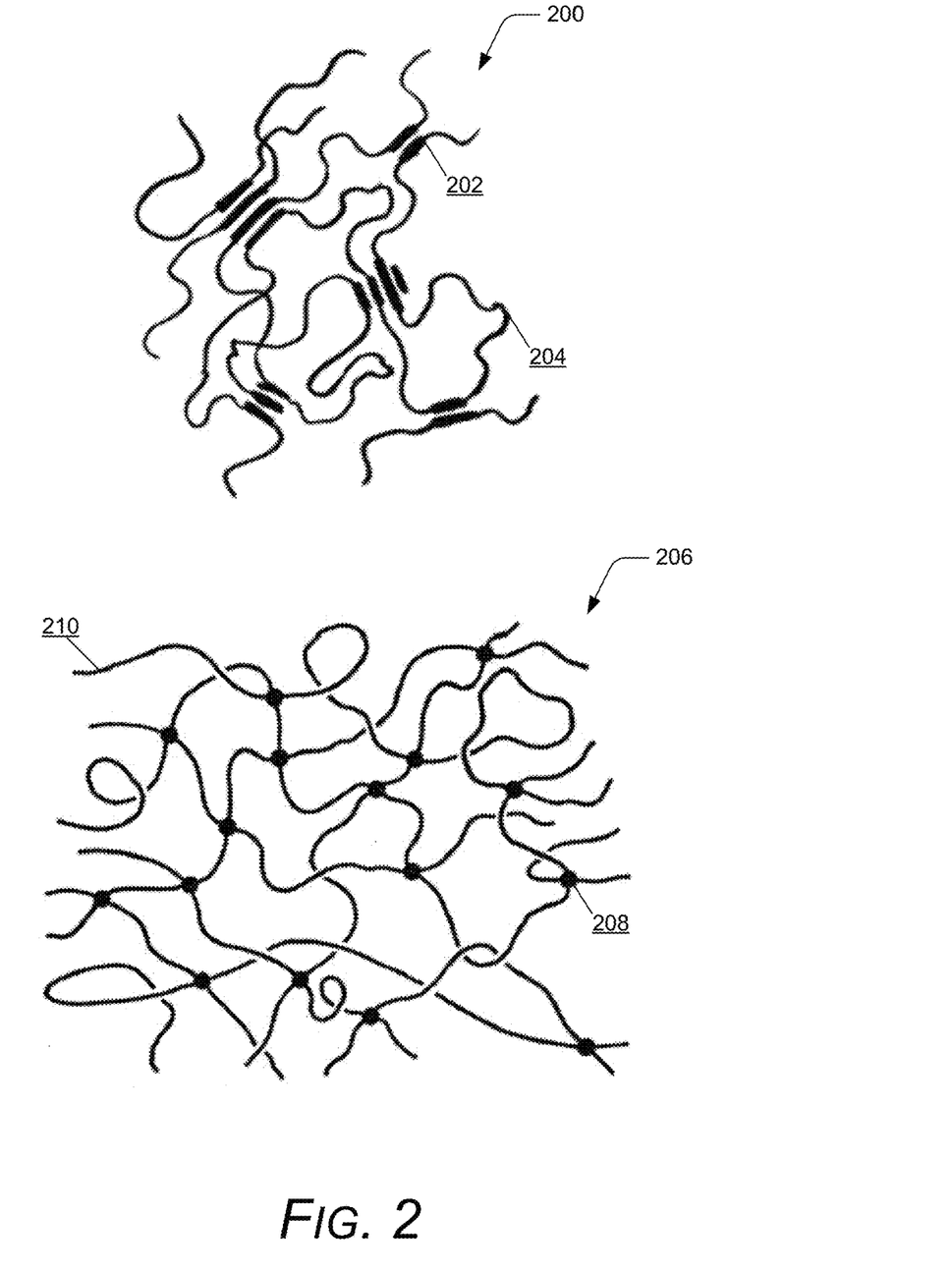
FIG. 2 illustrates examples of material structures that may be used to implement techniques of device component exposure protection as described herein.

For example, consider FIG. 2, which illustrates examples of material structures that may be used to implement techniques of device component exposure protection. A thermoplastic structure 200 is shown, having a number of thermo-reversible bonds 202 forming crystals between chains 204 of the TP. The thermo-reversible bonds 202 cross-link the chains 204, allowing the TP structure 200 to be stretched between the thermo-reversible bonds and return to nearly the original shape of the TP structure.

As discussed above, different TP formulations may be used for different applications from one device to another, or for various components within the same computing device. Based on materials of the components, the TP are implemented to adhere to manufacturing time constraints, space constraints within the computing device, likelihood of a component being moved during assembly or device rework, and so forth. Therefore, different TP formulations may be considered using criterion such as softening temperature to elevate the minimum rework temperature; application or bonding temperature, to elevate material solidification conditions and heat dissipation requirements during processing; working time to evaluate assembly requirements; 180° peel strength, to elevate substrate adhesion strength; elastic modulus at room temperature, to elevate strength of the TP; and so forth.

Figure 3:
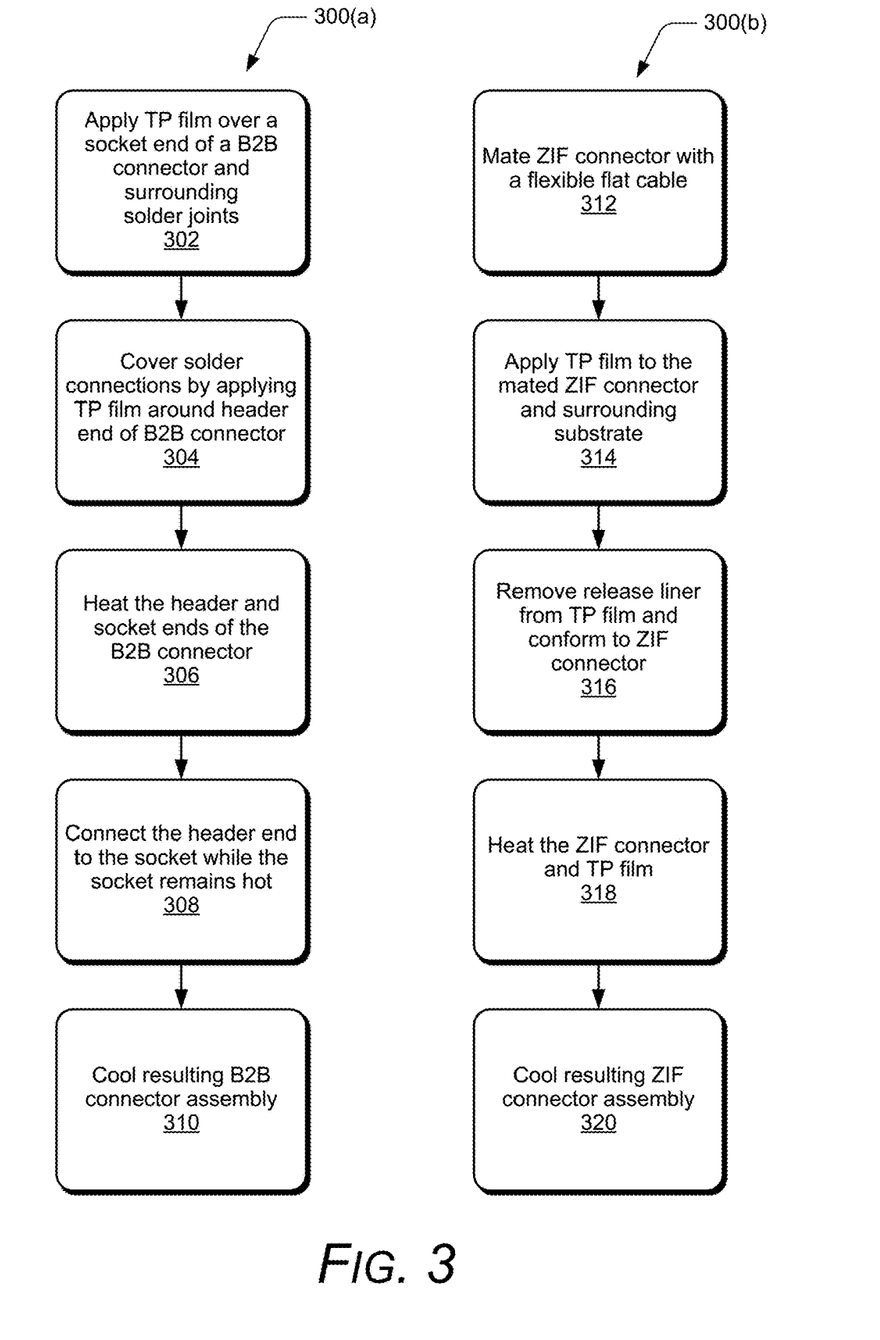
FIG. 3 illustrates example methods of applying thermoplastic (TP) film to different connector types, which may be used in implementations of device component exposure protection in accordance with the techniques described herein.

In but one example, performance criterion for selection of a particular TP formulation can include a maximum rework temperature of 85° C.; TP not being brittle, as brittleness can cause failure during use of the computing device and life cycle testing including device drops; re-tension force of the TP unable to break the electrical connectors in the computing device when the connector is decoupled; and the TP does not break when it is reshaped around electrical connectors. Two TP films meeting these criteria are shown in Table 1 below:

which the TP film is applied. A release liner is removed from the TP film, and the TP film is conformed tightly around the ZIF connector (block 316). The mated ZIF connector and TP film are heated (block 318) to form a seal around the ZIF connector. The mated ZIF connector and TP film may be heated to around 80° C. for 10-20 seconds, although the heat temperature and application time may vary based on different TP films used and the material to which the TP film is applied.

| Product ID | Type/form | Softening Temp, ° C. (min rework temp) | Application- Bonding Temp, ° C. | Working Time (once heat is removed) | 70-80° C. bonding temp 180 deg Peel Strength, N/cm | 10N load at RT Elastic Modulus @ RT, MPa |
|---|---|---|---|---|---|---|
| E | 2 milt film | 60 | 70-80 | 5+ min | 15-20 (PC/Al) | 4.6 |
| F | 1 & 2 milt films | 80 | 80-90 | 5+ min | 11-12 (Al/SS) | 1.6 |

TP films may be applied to electrical and non-electronic components of a device in a variety of ways. For example, consider FIG. 3, which illustrates example methods 300(a) and 300(b) of applying TP film to different connector types in implementations of device component exposure protection. A first method 300(a) relates to TP film application with board-to-board (B2B) connectors. First, a TP film is applied over a socket end of a B2B connector and applied to surrounding solder joints (block 302). The TP film is applied with a TP film tight-release liner in place and a TP film easy-release liner removed. To apply, the TP film is pressed to a substrate (e.g., the substrate assembly 116 of FIG. 1) to initialize a bond between the TP film and the B2B connector. The tight-release liner is then removed, and the TP film is conformed around the socket. The TP film may be applied at room temperature.

Solder connections are covered by applying the TP film around a header end of the B2B connector (block 304). The TP film is not applied directly to contacts on the header end of the B2B connector. The header and the socket ends of the B2B connector are then heated (block 306), such as to a temperature around 80° C., although the heat temperature may vary based on different TP films used and the material to which the TP film is applied. Heating the header and the socket ends of the B2B connector thus heats the TP film applied to each. The header end of the B2B connector is connected to the socket while the socket remains hot (block 308). Once connected, the B2B connector and the socket form a B2B assembly, which is then cooled (block 310) for further device assembly or device use.

The B2B assembly can be decoupled after completion of the process 300(a), such as in device rework or repair. In one example, the B2B assembly is heated to ≤70° C. to unlock the thermo-plastic bonds of the TP film, although different formulations of TP film may require heating to different temperatures for decoupling. The B2B connector is disconnected from the socket while warm to prevent damage to the connector.

The second method 300(b) relates to TP film application with zero insertion force (ZIF) connectors. First, a ZIF connector is mated with a flexible flat cable (block 312). A TP film is applied to the mated ZIF connector and surrounding substrate (e.g., the substrate assembly 116 of FIG. 1) (block 314). The TP film may be applied to the mated ZIF connector at around 80° C. to initialize adhesion between the substrate and the TP film, although the heat temperature may vary based on different TP films used and the material to The ZIF connector may be decoupled at room temperature in this example without reheating using the TP-E and TP-F ("Product IDs") shown in Table 1. However, the TP-E and TP-F films may need to be applied with each mating of the ZIF connector to the substrate.

Returning to a discussion of FIG. 1, application of the TP film 120 to the device components 112 may be executed during device assembly without further operations to device component exposure protection. However, in some examples, LME is applied to the device components 112 in addition to, or alternatively from, application of the TP film 120 to provide device component exposure protection. For example, consider the third stage of assembly 108, where LME 122 has been applied to the device components 112 within the housing 114.

In this example, the LME 122 is applied to various ones of the device components 112 by filling void spaces in the device housing 114 with a liquid precursor formulation of LME. Then, the liquid precursor of the LME 122 is cross-linked or cured using heat and/or exposure to ultraviolet (UV) radiation to encapsulate the device components 112 attached to the substrate assembly 116. In the third stage of assembly 108, the device housing 114 has been partially filled with the LME 122 precursor, as represented by several device components 124 which are large enough to not yet be entirely submerged by the liquid LME precursor. However, the several device components 124 remain covered by the TP film 120 as described above as the LME 122 precursor is applied.

In one or more implementations of device component exposure protection, the LME 122 is formed of polymeric chains (e.g., acrylate, acrylate ester, urethane acrylate oligomer, synthetic resin, silicone, and so forth) that are cross-linked by one or more techniques such as UV, thermal, or chemical curing, to name a few examples. Polymeric chains refer to a large molecule, or macromolecule, composed of many repeated subunits (monomers). The LME 122 may be comprised of hydrophobic groups and/or lipophilic groups, for instance, to increase water resistance or waterproofing around one or more of the device components 112. Hydrophobic and/or lipophilic materials can be tailored to achieve different properties within the same device or different devices, such as to increase waterproofing for device components that may be more likely to be exposed to water. In cases where the LME and/or TP include more than one type of hydrophobic and/or lipophilic group, the different polymers can be derived from the same monomer or from different monomers.

The LME 122 may be formed with a lubricious component, and/or may be formed from liquid precursors. When the LME 122 is formed with liquid precursors, the liquid precursors may be cross-linked by exposure to UV radiation and/or heating to ≤70° C. for approximately 30 minutes, although the heat temperature and application time may vary based on different LME precursors used and the material to which the LME precursors are applied.

In one example, the LME 122 includes resins, a photo-initiator, and a thermal initiator which cross-link the LME upon exposure to UV radiation and/or heat ≤70° C. In this example, the LME 122 may be comprised of 40-50-wt % synthetic resins, 13-23-wt % acrylic esters, 15-20-wt % low-molecular weight resin, less than 7-wt % thermal initiator, and less than 7-wt % photo-initiators.

The mechanical and transport properties of the LME depend on a number of factors, including, for example, the In the third stage of assembly 108, the LME 122 first wets the surface of one or more interfaces between the electronic components 118 and the substrate assembly 116. A lubricious component in the LME 122 can be tailored to optimize surface wet ability. The LME 122 then bonds to the materials of the electronic components 118 and the substrate assembly 116 by covalent bonding, acid-base interaction, and/or mechanical interlocking. Mechanical interlocking refers to liquid precursors of the LME 122 that flow into pores in adhered surfaces of the electronic components 118 and/or the substrate assembly 116, or around projections on the adhered surfaces.

Table 2 below indicates the mechanical characteristics of LME prepared from an optically clear, liquid precursor by cross-linking with UV-radiation, and the same LME formulated with lubricious components, measured by double lap-shear testing at room temperature with a strain rate of 0.5-mm/min.

| | | | | | | Low Deformation Rate = 0.5 mm/min | | |
|---|---|---|---|---|---|---|---|---|
| Sample ID | Chemistry | $T_g$ from DSC | Adhesive Thickness | Diluent | Diluent Vol % | Shear Modulus | Elongation at Elastic Limit | Shear Strength at Elastic Limit |
| A | Acrylic Ester & Urethane | −51 C | 0.1 mm | — | 0% | 49.8 kPa | 181% | 95.2 kPa |
| A + D | Acrylic Ester & Urethane | −51 C | 0.1 mm | a | 10% | 33 kPa | 310% | 98 kPa |
| B | Silicone mixture | | 0.1 mm | — | 0% | 96 kPa | 100% | 90 kPa |
| B + D | Silicone mixture | | 0.1 mm | b | 20% | 73 kPa | 160% | 75 kPa |
| B + D | Silicone mixture | | 0.1 mm | b | 30% | 33 kPa | 110% | 36 kPa |
| C | Synthetic Resin & Acrylic Esters | | 0.1 mm | — | 0% | 35 kPa | 280% | 100 kPa |
| C + D | Synthetic Resin & Acrylic Esters | | 0.1 mm | a | 20% | 22 kPa | 250% | 55 kPa | density of side chains attached to the LME polymer backbone, the length/size of the LME chains between the elastomer junctions, the elastomer junction functionality, the density of elastomer junctions, and the chemical nature of the elastomer chains (hydrophobic, lipophilic, or both). LME mechanical properties are controlled by formulation and resultant network structure where φ is the number of chains attached to a junction; ($\mu_j/V°$) is the junction density; and ν is the number of chains between junctions. The phrase "junction functionality" refers to the number of polymer chains emanating from a cross-link of a network. The LME network parameters are related to the cycle rank of a network (ξ) as follows: $\xi = \nu \; (\varphi-2)/\phi = \mu_j \; (\varphi-2)/2$. For example, again consider FIG. 2, which illustrates an LME structure 206, having a number of elastomer junctions 208 between chains 210 of the LME. The elastomer junctions 208 cross-link the chains 210 when heat and/or UV radiation is applied to the LME structure 206.

Returning to the discussion of FIG. 1, the LME 122 may be formed with a lubricious (e.g., diluent) component or mixture of components, which may or may not be covalently incorporated into the LME. The lubricious component may be utilized to optimize the cross-link density of the LME 122 and the movement of polymer chains and network junctions in response to an applied stress, and to tailor the peel strength of the LME to a specific substrate, to name a few examples. Mechanically, adding a lubricious component to the LME impacts the extension ratio (direction 1) to $\lambda_1 = \alpha (V/V_o)^{1/4}$ where α is the ratio of LME volumes without and with the lubricious component. In a similar fashion, directions 2 and 3 are mutually perpendicular and perpendicular to direction 1, as represented by $\lambda_2 = \lambda_3 = \alpha^{-1/2} (V/V_o)^{1/3}$.

The diluent "a" refers to diphenyl-dimethylsiloxane copolymer, and the diluent "b" refers to butyl-terminated polydimethylisoxane. In general the LME in Table 2 have low-modulus and glass transition ("Tg") below −50° C. The phrase "glass transition" refers to the temperature where a reversible transition occurs in amorphous materials (or within amorphous regions within semicrystalline materials) from a hard and relatively brittle "glassy" state into a rubber-like state, as the temperature is increased. Lubricious components used in LME are, but not limited to, the diphenyl-dimethylsiloxane copolymer and butyl-terminated polydimethylsiloxane shown in Table 2. Low deformation rate shear moduli typically decrease in LME formulations containing increasing amounts of additives, or diluents, because they have lower cross-link densities compared with LME without additives. In the acrylic-based LME (A in Table 2), interactions between the diluent and the elastic component of the LME are observed and present evidence that methodologies to tailor the Tg and peel strength of a LME by choice of lubricious component may achieve desired properties based on specific application requirements.

Figure 4:
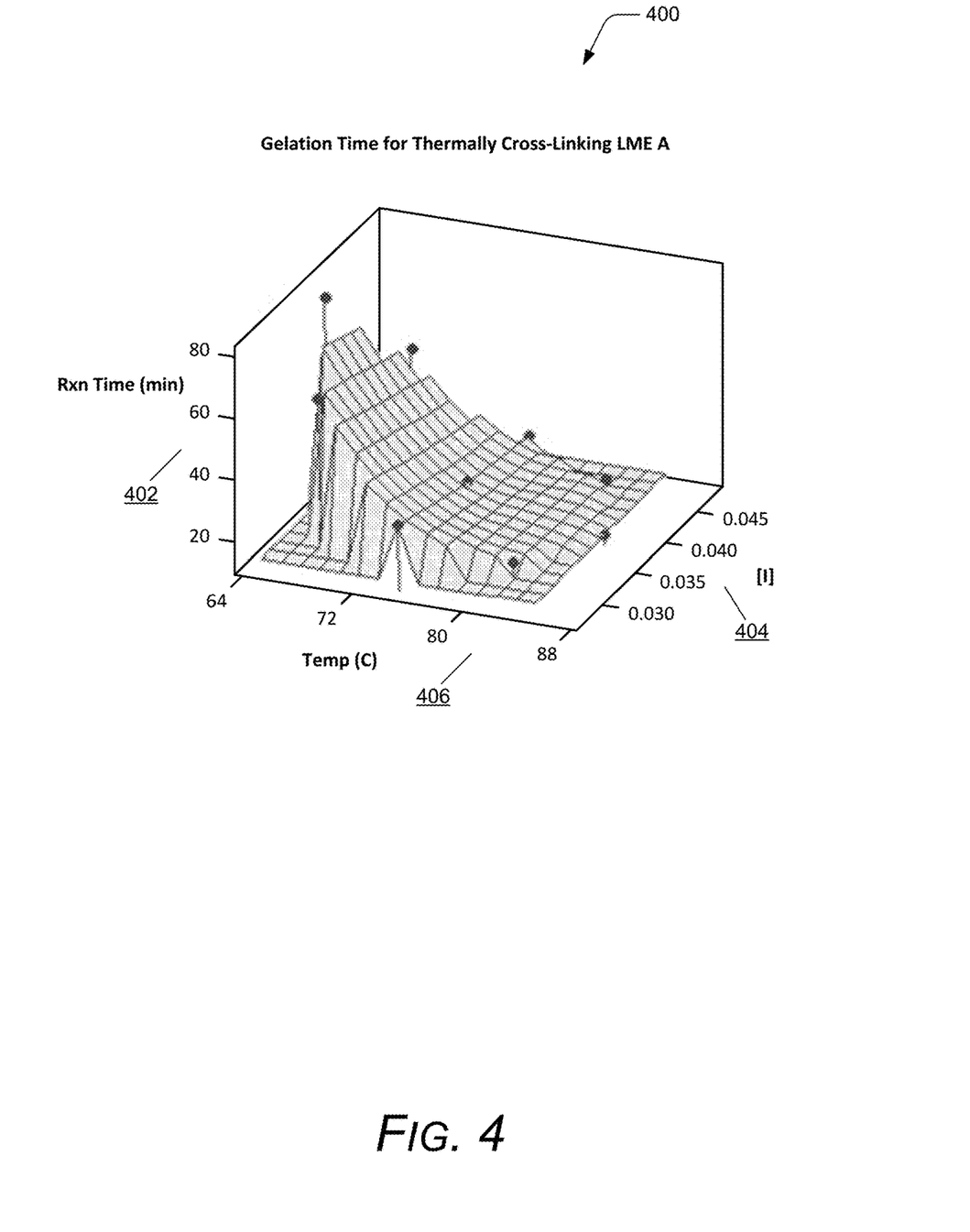
FIG. 4 illustrates an example representation of reaction time as a function of initiator concentration and reaction temperature in accordance with one or more implementations of the techniques described herein

Thermally activated and/or UV activated free-radical initiators may be added to an LME precursor formulation to affect cross-linking by heating the LME at temperatures to ≤70° C., and/or exposure to UV radiation, respectively. Examples of thermally activated free-radical initiators include, but are not limited to, azobisisobutyronitrile (AIBN), acetyl peroxide, benzoyl peroxide, dicumyl peroxide, and lauryl peroxide. For example, consider FIG. 4, which illustrates an example representation 400 of reaction time as a function of initiator concentration and reaction temperature. A thermally activated free-radical initiator may be incorporated into an LME liquid precursor formulation at initiator concentrations of approximately 0.015 moles/kg LME precursor to 0.4 moles/kg LME precursor. The representation 400 plots LME cross-linking reaction time 402 as a function of initiator concentration [I] 404 and reaction temperature 406 for AIBN. Although AIBN is used as an example in FIG. 4, it is understood that one or a combination of multiple thermally activated free-radical initiators may be incorporated into LME liquid precursor formulations for different device and component scenarios.

Returning to the discussion of FIG. 1, the LME 122 is shown as being applied in the third stage of assembly 108 when the device housing 114 is in a horizontal orientation, such as with a display of the device housing face-down. In the third stage of assembly 108, the back of the device housing 114 has not yet been assembled with the rest of the device housing, leaving an open face of the device to apply the LME 122 liquid precursor. Turning to a fourth stage of assembly 110, the device housing 114 has been flipped around (indicated by the arrow 126) and such that the display of the device 102 is visible. The fourth stage of assembly 110 occurs after the TP and/or LME components have been applied to the device components 112 and any necessary solidification of the TP and/or LME components has taken place. The fourth stage of assembly 110 may include addition of any remaining portions of the device housing 114 to the computing device 102, such as assembly of the back portion of the device housing.

Although the LME 122 is shown as being applied with the computing device 102 in a horizontal position and the device display facing down, the LME 122 may be applied with the device in any suitable orientation (e.g., horizontal, vertical, or any angle in between). Additionally, the LME 122 may be applied via different portions of the device housing 114, such as through one or more ports that connect internal portions of the computing device 102 with the external environment, such as after assembly of the computing device is complete.

Alternatively, or additionally, the LME 122 may be applied to the electronic components 118 attached to the substrate assembly 116 at the component level. For instance, the LME 122 may be applied to a specific area of the substrate assembly 116, or a region of an unassembled device, and cross-linked by applying UV radiation and/or heating to ≤70° C. for a time required to cross-link the LME, to name a few examples. The electronic components 118 may be assembled into a completed device subsequent to LME treatment.

In another example, the LME 122 may be applied to the electronic components 118 attached to the substrate assembly 116 at the device level. In this case, the LME 122 is injected into an assembled device through one or more ports, such as a SIM tray or another port designed for injection. As discussed above, the LME is then cross-linked by applying UV radiation and/or heating to ≤70° C. for a time required to cross-link the LME, to name a few examples. In yet another example, the LME 122 may be applied to a subset of the electronic components 118 at the component level, followed by assembly of the device and application of additional LME to the device components 112 at the device level.

In some cases, different areas of the substrate assembly 116 are encapsulated with different LME and/or TP to enable specific functionality of the computing device 102, or to cover areas of closely-spaced electronic components 118 while leaving other areas of the substrate assembly 116 without any application of LME and/or TP. Leaving areas of the substrate assembly 116, such as connectors, without application of LME and/or TP allows electronic components 118 located at these areas of the substrate assembly to be reconfigured or repaired without additional heating or curing steps, for example.

As discussed above, different combinations of LME and/or TP may be used to achieve different functionalities within a single electronic device. For example, a first electronic component is treated with a first LME and/or TP, and a second electronic component is treated with a second LME and/or TP, which has different mechanical, electrical, thermal, or chemical properties than the first LME/TP. The first LME/TP may provide a relatively complaint and/or a reversible adhesion promoting layer, while the second LME/TP provides targeted electrical, thermal, and/or chemical protection.

In another example, the substrate assembly 116, such as a PCB, has an attached electrical connector that includes a housing and a plurality of leads attached to bonding pads formed on the PCB. The electrical connector may be positioned off of and attached to the PCB and an exterior surface of the housing of the electrical connector is spaced apart the leads attached to the PCB. A first LME and/or TP, which is compliant and enables multiple attachments, is applied directly to the electrical connector. A second LME and/or TP extends between the exterior surfaces of the housing to the PCB and covers the plurality of leads attached to the plurality of bonding pads.

Figure 5:
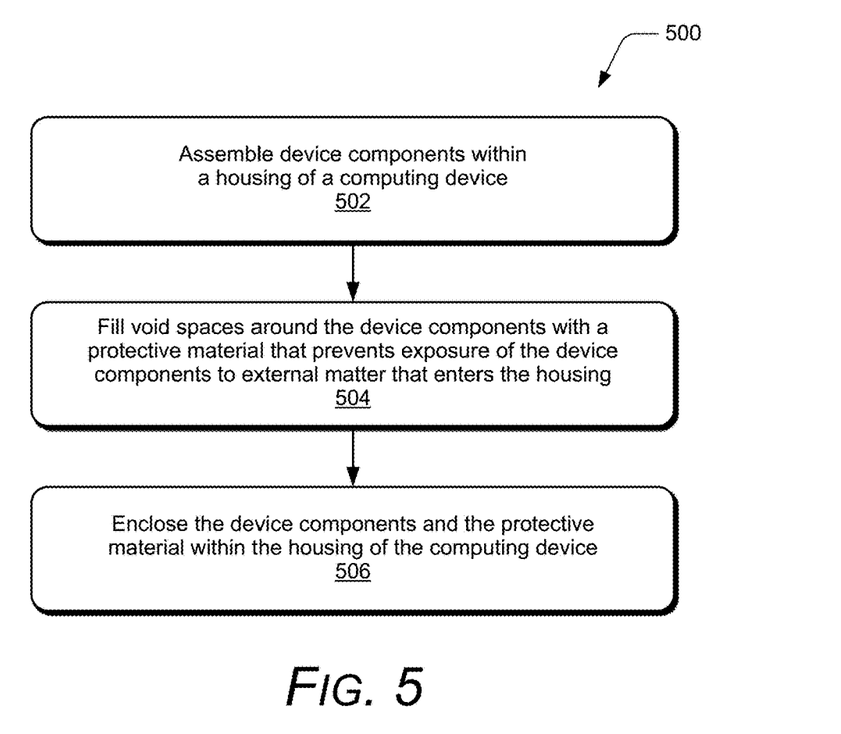
FIG. 5 illustrates an example method of assembling devices having component exposure protection in accordance with one or more implementations of the techniques described herein.

FIG. 5 illustrates an example method 500 of device component exposure protection. The order in which the method is described is not intended to be construed as a limitation, and any number or combination of the described method operations can be performed in any order to perform a method, or an alternate method.

At 502, device components are assembled within a housing of a computing device. For example, the device components 112 may include a substrate assembly 116, such as a PCB, and electronic components 118. The device components 112 may also include non-electronic components to be included for functioning of the computing device 102. One or more portions of the device housing 114 may be left unassembled to allow an opening for application a protective material to the device components 112.

At 504, void spaces are filled around the device components with a protective material that prevents exposure of the device components to external matter that enters the housing. In one example, the protective material may be the TP film 120, which covers one or a combination of the substrate assembly 116 and/or the electronic components 118. Alternatively or in addition, the protective material may be the LME 122, which covers one or a combination of the substrate assembly 116 and/or the electronic components 118.

To do so, the device housing 114 may be orientated with the device components 112 already assembled in order to facilitate filling the void spaces around the device components in the housing. For instance, the LME 122 may be applied via an opening in the device housing 114 as a liquid precursor while the device housing is in a horizontal position to fill the void spaces around the device components 112, followed by application of heat ≤70° C. and/or UV radiation to cure the LME. Different combinations of TP and/or LME may be used within a single computing device 102 depending on which device components 112 are included in the computing device 102, whether the computing device will need rework during assembly, how different components of the device may need to be repaired subsequent to delivering the device to market, which of the device components need more or less shock protection, and so forth.

At 506, the device components and the protective material are enclosed within the housing of the computing device. For instance, the one or more portions of the device housing 114 that were left unassembled to allow the opening for application of the protective material are now added to the device housing to complete assembly of the computing device 102.

Figure 6:
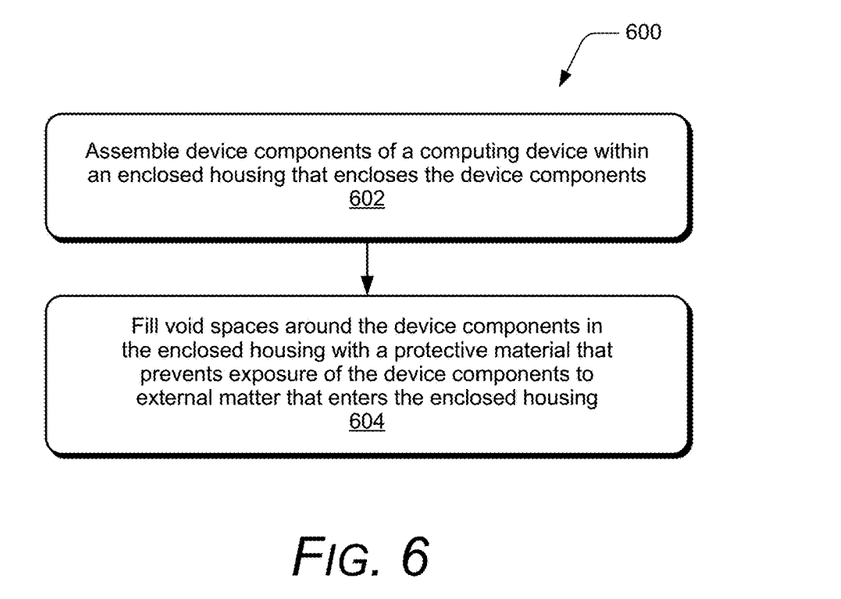
FIG. 6 illustrates an example method of including component exposure protection in an assembled device in accordance with one or more implementations of the techniques described herein.

FIG. 6 illustrates an example method 600 of device component exposure protection. The order in which the method is described is not intended to be construed as a limitation, and any number or combination of the described method operations can be performed in any order to perform a method, or an alternate method.

At 602, device components of a computing device are assembled within an enclosed housing that encloses the device components. For example, the device components 112 may include a substrate assembly 116, such as a PCB, and electronic components 118. The device components 112 may also include non-electronic components to be included for functioning of the computing device 102. In this example, the device housing 114 may be fully assembled to enclose the device components 112.

At 604, void spaces are filled around the device components in the enclosed housing with a protective material that prevents exposure of the device components to external matter that enters the enclosed housing. For instance, the protective material may be the LME 122, which covers one or a combination of the substrate assembly 116 and/or the electronic components 118. The LME 122 may be applied via an opening in the assembled device housing 114 as a liquid precursor via a port or opening in the device housing to fill the void spaces around the device components 112, followed by application of heat ≤70° C. and/or UV radiation to cure the LME. The opening may be a SIM tray or another port designed for injection, to name a few examples. Different combinations LME may be used within a single computing device 102 depending on which device components 112 are included in the computing device 102, whether the computing device will need rework during assembly, how different components of the device may need to be repaired subsequent to delivering the device to market, which of the device components need more or less shock protection, and so forth.

The features of device component exposure protection described herein render devices, such as mobile devices, mechanically robust and waterproof. For example, electronic components and connectors included in conventional devices are typically vulnerable to moisture damage or ingress, which can cause electrical shorts and dendrite growth between circuit elements maintained at different electrical potential. However, device components treated with the techniques described herein, such as PCB boards with LME and/or TP protected ZIF connectors, measured no leakage current up to 12 VDC bias and did not exhibit corrosion current when covered with water. Corrosion current, for instance, can be measured by various techniques, such as using a Hewlett Packard 34401A Multimeter placed in series in the circuit to measure current.

Additionally, device components treated using LME, and LME with TP, were tested using procedures specified by IEC standard 60529 water tests. Under these conditions, devices containing components treated with LME were tested in the off-state and the on-state for times ranging from 30 minutes to 4 hours immersed in around 1.5 meters of water. Following the tests, the devices containing components treated with LME operated per device specifications and displayed corrosion resistance by performing for 3 hours in the on-state. Further, the devices containing components treated with LME operated per device specifications and displayed corrosion resistance after being tested in the off-state for 30 minutes in around 2.5 meters of water.

In another example, devices containing components treated with LME were dropped in pool water containing chlorine to a depth of 4.27 meters to simulate, for instance, a user dropping the device into the pool as a result of a jarring collision, and the user dropping the device repeatedly into the pool. In both cases, the devices containing components treated with LME operated per device specifications after being retrieved. Additionally, the devices containing components treated with LME were able to perform video recordings while under water.

Figure 7:
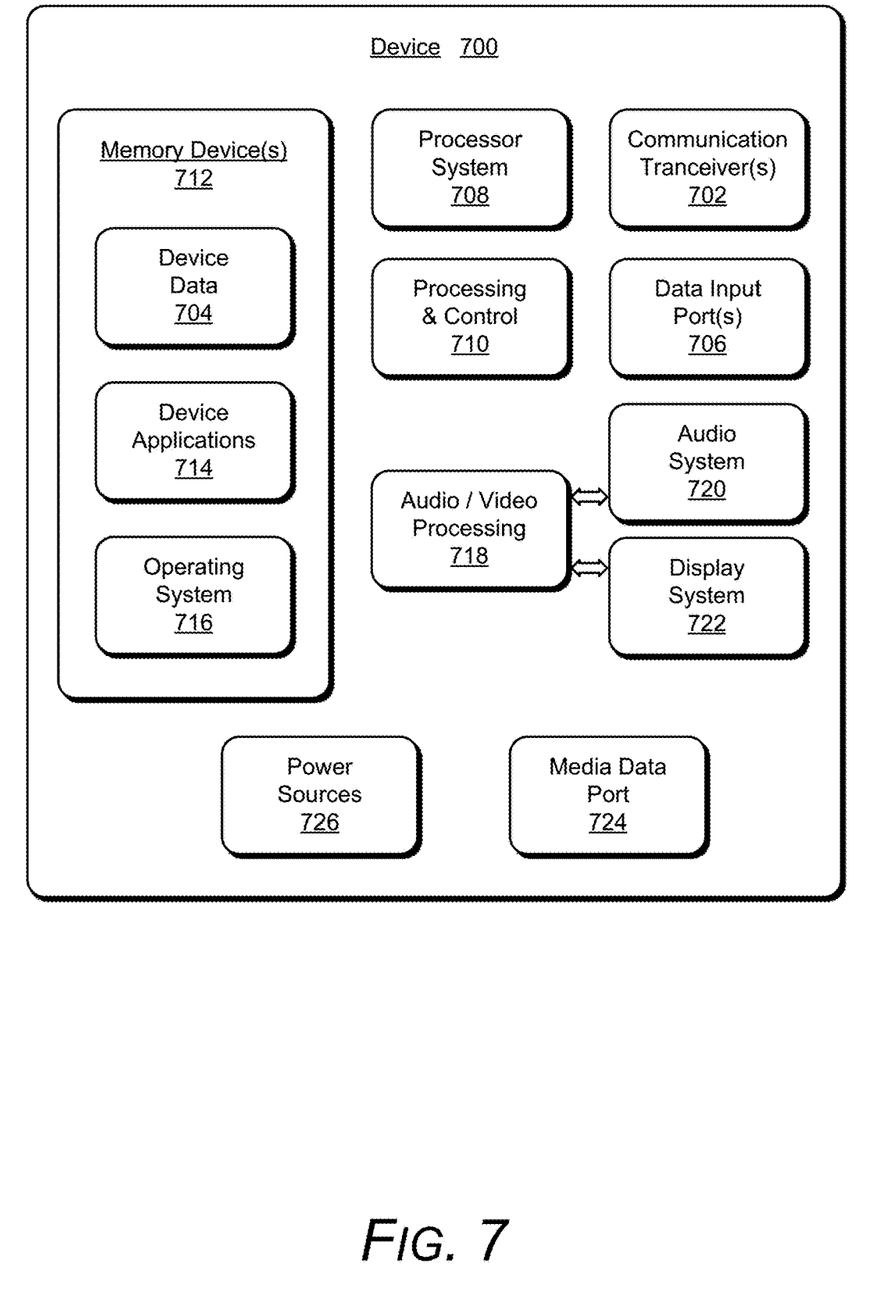
FIG. 7 illustrates various components of an example device that can be used as an example of device component exposure protection.

FIG. 7 illustrates various components of an example device 700, which can implement examples of device component exposure protection. The example device 700 can be implemented in any form of an electronic and/or computing device, such as a mobile device. For example, the computing device 102 shown and described with reference to FIGS. 1-6 may be implemented as the example device 700.

The device 700 includes communication transceivers 702 that enable wired and/or wireless communication of device data 704 with other devices. The device data 704 can include device information and settings, such as information regarding how the device 700 and its components have been treated to have waterproof and/or water-resistant properties using the techniques described herein. The device data 704 can also include suggested techniques and information on how to treat the device 700 during repair, such as which portions of the device have been treated with LME and/or TP, how to reheat the LME and/or TP to return the protective material to a liquid state, and so forth. Additionally, the device data 704 can include any type of audio, video, and/or image data. Example transceivers include wireless personal area network (WPAN) radios compliant with various IEEE 802.15 (Bluetooth™) standards, wireless local area network (WLAN) radios compliant with any of the various IEEE 802.11 (WiFi™) standards, wireless wide area network (WWAN) radios for cellular phone communication, wireless metropolitan area network (WMAN) radios compliant with various IEEE 802.16 (WiMAX™) standards, and wired local area network (LAN) Ethernet transceivers for network data communication.

The device 700 may also include one or more data input ports 706 via which any type of data, media content, and/or inputs can be received, such as user-selectable inputs to the device, messages, music, television content, and any other type of audio, video, and/or image data received from any content and/or data source. The data input ports may include USB ports, coaxial cable ports, and other serial or parallel connectors (including internal connectors) for flash memory, DVDs, CDs, and the like. These data input ports may be used to couple the device to any type of components, peripherals, or accessories such as microphones and/or cameras. The data input ports may also be used in one or more implementations to transfer protective materials such as LME and/or TP to the interior of the device 700, as described above.

The device 700 includes a processing system 708 of one or more processors (e.g., any of microprocessors, controllers, and the like) and/or a processor and memory system implemented as a system-on-chip (SoC) that processes computer-executable instructions. The processor system may be implemented at least partially in hardware, which can include components of an integrated circuit or on-chip system, an application-specific integrated circuit (ASIC), a field-programmable gate array (FPGA), a complex programmable logic device (CPLD), and other implementations in silicon and/or other hardware. Alternatively or in addition, the device can be implemented with any one or combination of software, hardware, firmware, or fixed logic circuitry that is implemented in connection with processing and control circuits, which are generally identified at 710. The device 700 may further include any type of a system bus or other data and command transfer system that couples the various components within the device. A system bus can include any one or combination of different bus structures and architectures, as well as control and data lines.

The device 700 also includes computer-readable storage memory 712 that enables data storage, such as data storage devices that can be accessed by a computing device, and that provide persistent storage of data and executable instructions (e.g., software applications, programs, algorithms, functions, and the like). Examples of the computer-readable storage memory 712 include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage memory devices in various memory device configurations. The device 700 may also include a mass storage media device.

The computer-readable storage memory 712 provides data storage mechanisms to store the device data 704, other types of information and/or data, and various device applications 714 (e.g., software applications). For example, an operating system 716 can be maintained as software instructions with a memory device and executed by the processor system 708. The device applications may also include a device manager, such as any form of a control application, software application, signal-processing and control module, code that is native to a particular device, a hardware abstraction layer for a particular device, and so on.

The device 700 also includes an audio and/or video processing system 718 that generates audio data for an audio system 720 and/or generates display data for a display system 722. The audio system and/or the display system may include any devices that process, display, and/or otherwise render audio, video, display, and/or image data. Display data and audio signals can be communicated to an audio component and/or to a display component via an RF (radio frequency) link, S-video link, HDMI (high-definition multimedia interface), composite video link, component video link, DVI (digital video interface), analog audio connection, or other similar communication link, such as media data port 724. In implementations, the audio system and/or the display system are integrated components of the example device. Alternatively, the audio system and/or the display system are external, peripheral components to the example device.

The device 700 can also include one or more power sources 726, such as when the device is implemented as a mobile device or portable camera device. The power sources may include a charging and/or power system, and can be implemented as a flexible strip battery, a rechargeable battery, a charged super-capacitor, and/or any other type of active or passive power source.

Although implementations of device component exposure protection have been described in language specific to features and/or methods, the subject of the appended claims is not necessarily limited to the specific features or methods described. Rather, the specific features and methods are disclosed as example implementations of device component exposure protection, and other equivalent features and methods are intended to be within the scope of the appended claims. Further, various different examples are described and it is to be appreciated that each described example can be implemented independently or in connection with one or more other described examples. Additional aspects of the techniques, features, and/or methods discussed herein relate to one or more of the following:

A computing device, comprising: device components enclosed within a housing of the computing device; and a protective material contained within the housing and filling void spaces around the device components, the protective material preventing exposure of the device components to external matter that enters the housing.

Alternatively, or in addition to the above described computing device, any one or combination of: the computing device is a mobile device having a display, and the display and the housing form an enclosure around the device components. The protective material protects the device components from the external matter from inside-out of the computing device. The protective material waterproofs the device components from the external matter from inside-out of the computing device. The protective material comprises one or more thermoplastic (TP) materials. The one or more TP materials are applied to one or more of the device components as a TP film. The protective material comprises one or more low-modulus elastomer (LME) materials. The one or more LME materials are applied as a liquid precursor to one or more of the device components followed by curing the one or more LME materials. The protective material comprises one or more TP materials, and one or more LME materials. The protective material is comprised of one or more hydrophobic or lipophilic materials.

A method, comprising: assembling device components within a housing of a computing device, the housing enclosing the device components of the computing device upon completion of the assembling; and filling void spaces around the device components with a protective material that prevents exposure of the device components to external matter that enters the housing upon said completion of the assembling.

Alternatively, or in addition to the above described method, any one or a combination of: filling the void spaces around the device components is completed prior to said completion of the assembling. Orientating the housing with the assembled device components to facilitate said filling the void spaces around the device components in the housing. The protective material is in a liquid state for said filling the void spaces around the device components. Curing the protective material that is in the liquid state with heat and/or ultraviolet (UV) radiation. The protective material comprises one or more low-modulus elastomer (LME) materials and/or one or more thermoplastic (TP) materials. The protective material protects the device components from the external matter from inside-out of the computing device.

A protective material, comprising: a liquid precursor for application around device components enclosed within a device housing; and a cured state of the liquid precursor preventing exposure of the device components to external matter that enters the device housing, the cured state occurring based on application of heat and/or ultraviolet (UV) radiation to the liquid precursor.

Alternatively, or in addition to the above described protective material, any one or a combination of: the protective material comprises one or more low-modulus elastomer (LME) materials and/or one or more thermoplastic (TP) materials. The protective material is comprised of one or more hydrophobic or lipophilic materials. The protective material protects the device components from the external matter from inside-out of the device housing.

What is claimed is:

1. A computing device, comprising:
    device components enclosed within a housing of the computing device; and
    a protective material contained within the housing and applied as a liquid precursor, filling void spaces around the device components, the protective material in a cured state preventing exposure of the device components to external matter that enters the housing.

2. The computing device as recited in claim 1, wherein the computing device is a mobile device having a display, and wherein the display and the housing form an enclosure around the device components.

3. The computing device as recited in claim 1, wherein the protective material protects the device components from the external matter from inside-out of the computing device.

4. The computing device as recited in claim 1, wherein the protective material waterproofs the device components from the external matter from inside-out of the computing device.

5. The computing device as recited in claim 1, wherein the protective material comprises one or more thermoplastic (TP) materials.

6. The computing device as recited in claim 5, wherein the one or more TP materials are applied to one or more of the device components as a TP film.

7. The computing device as recited in claim 1, wherein the protective material comprises one or more low-modulus elastomer (LME) materials.

8. The computing device as recited in claim 7, wherein the one or more LME materials are applied as the liquid precursor to one or more of the device components followed by curing the one or more LME materials.

9. The computing device as recited in claim 1, wherein the protective material comprises one or more thermoplastic (TP) materials, and one or more low-modulus elastomer (LME) materials.

10. The computing device as recited in claim 1, wherein the protective material is comprised of one or more hydrophobic or lipophilic materials.

11. A method comprising:
    assembling device components within a housing of a computing device, the housing enclosing the device components of the computing device upon completion of the assembling; and
    filling void spaces around the device components with a protective material applied as a liquid precursor, the protective material in a cured state prevents exposure of the device components to external matter that enters the housing upon said completion of the assembling.

12. The method as recited in claim 11, wherein said filling the void spaces around the device components is completed prior to said completion of the assembling.

13. The method as recited in claim 11, further comprising orientating the housing with the assembled device components to facilitate said filling the void spaces around the device components in the housing.

14. The method as recited in claim 13, wherein the protective material is in a liquid state for said filling the void spaces around the device components.

15. The method as recited in claim 14, further comprising curing the protective material that is in the liquid state with one of: heat, ultraviolet (UV) radiation, or a combination of the heat and the UV radiation.

16. The method as recited in claim 11, wherein the protective material comprises one of: one or more low-modulus elastomer (LME) materials, one or more thermoplastic (TP) materials, or a combination of the one or more LME materials and the one or more TP materials.

17. The method as recited in claim 11, wherein the protective material protects the device components from the external matter from inside-out of the computing device.

18. A protective material, comprising:
    a liquid precursor for application around device components enclosed within a device housing; and
    a cured state of the liquid precursor preventing exposure of the device components to external matter that enters the device housing, the cured state occurring based on application of one of: heat, ultraviolet (UV) radiation, or a combination of the heat and the UV radiation to the liquid precursor.

19. The protective material as recited in claim 18, wherein the protective material comprises one of: one or more low-modulus elastomer (LME) materials, one or more thermoplastic (TP) materials, or a combination of the one or more LME materials and the one or more TP materials.

20. The protective material as recited in claim 18, wherein the protective material is comprised of one or more hydrophobic or lipophilic materials.

21. The protective material as recited in claim 18, wherein the protective material protects the device components from the external matter from inside-out of the device housing.

* * * * *